US008922755B2

(12) United States Patent
Seijger et al.

(10) Patent No.: US 8,922,755 B2
(45) Date of Patent: Dec. 30, 2014

(54) SUPPORT STRUCTURE, INSPECTION APPARATUS, LITHOGRAPHIC APPARATUS AND METHODS FOR LOADING AND UNLOADING SUBSTRATES

(75) Inventors: Olav Johannes Seijger, Eindhoven (NL); Martinus Joseph Kok, Eindhoven (NL); Sander Kerssemakers, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 764 days.

(21) Appl. No.: 12/988,703

(22) PCT Filed: Apr. 23, 2009

(86) PCT No.: PCT/EP2009/002959
§ 371 (c)(1),
(2), (4) Date: Jan. 4, 2011

(87) PCT Pub. No.: WO2009/132800
PCT Pub. Date: Nov. 5, 2009

(65) Prior Publication Data
US 2011/0109896 A1   May 12, 2011

Related U.S. Application Data

(60) Provisional application No. 61/071,440, filed on Apr. 29, 2008.

(51) Int. Cl.
*G03F 7/20* (2006.01)
*H01L 21/687* (2006.01)

(52) U.S. Cl.
CPC .......... *G03F 7/707* (2013.01); *H01L 21/68742* (2013.01)
USPC .............................................. 355/72; 355/53

(58) Field of Classification Search
CPC .................... G03F 7/707; H01L 21/68742
USPC ........................................ 355/72, 53; 414/754
See application file for complete search history.

(56) References Cited

U.S. PATENT DOCUMENTS

| 6,183,189 | B1 | 2/2001 | Lzu et al. |
| 2007/0291242 | A1 | 12/2007 | Sato |
| 2008/0056857 | A1 | 3/2008 | Hiroki |

FOREIGN PATENT DOCUMENTS

| EP | 1 628 164 A2 | 2/2006 |
| JP | 2002-198353 A | 7/2002 |

OTHER PUBLICATIONS

International Preliminary Report on Patentability and Written Opinion directed to related International Patent Application No. PCT/EP2009/002959, mailed Nov. 11, 2010 from the International Bureau of WIPO, Geneva, Switzerland; 8 pages.
English-Language Abstract for Japanese Patent Publication No. 2002-198353 A, published Jul. 12, 2002; 1 page.
International Search Report directed to related International Patent Application No. PCT/EP2009/002959, mailed Aug. 17, 2009; 2 pages.

*Primary Examiner* — Peter B Kim
(74) *Attorney, Agent, or Firm* — Sterne, Kessler, Goldstein & Fox P.L.L.C.

(57) ABSTRACT

A substrate support, configured to support a substrate during a process within a lithography system, includes a lifting structure configured to move the substrate between a first position, in which a lifting face of the lifting structure supports the substrate at a position set apart from a support surface of the substrate support, and a second position, in which the lifting structure does not prevent the substrate from being supported by a support surface of the substrate support; wherein, in moving between the first and second positions, the substrate moves in a combination of movement substantially perpendicular to a plane parallel to the support surface and movement substantially parallel to the support surface.

21 Claims, 5 Drawing Sheets

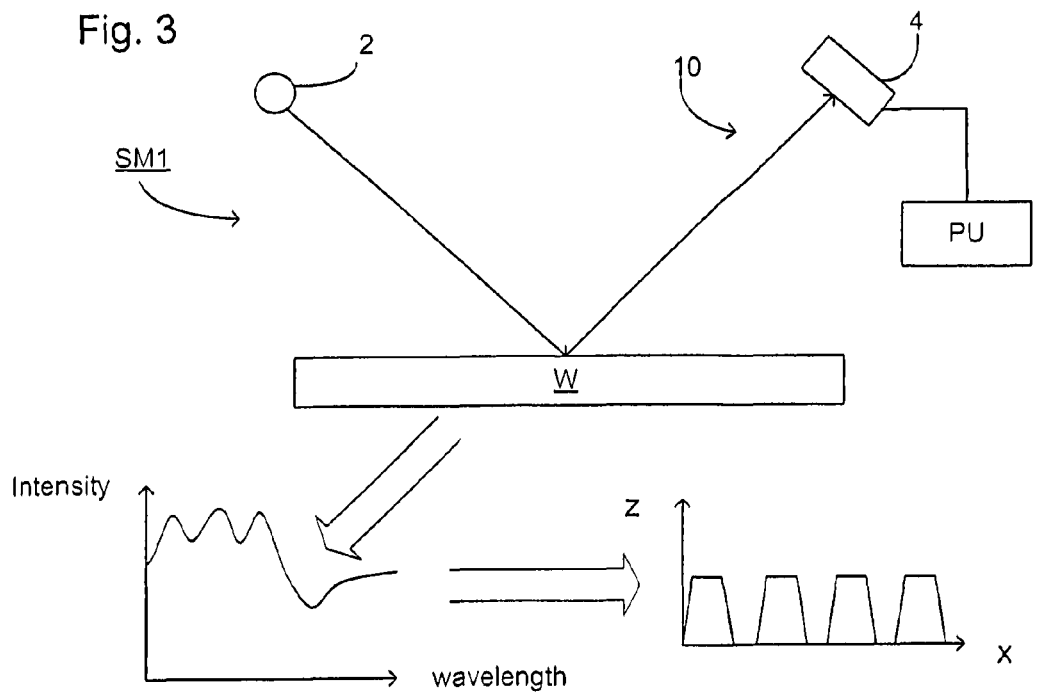
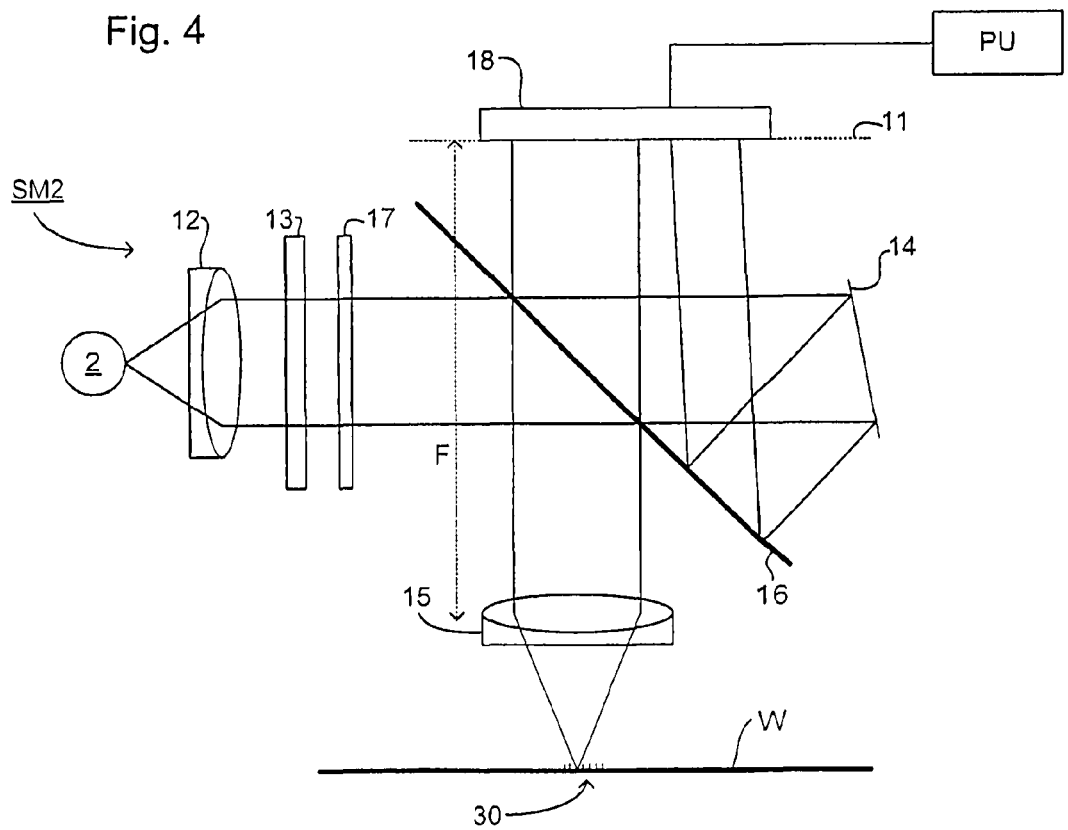

SUPPORT STRUCTURE, INSPECTION APPARATUS, LITHOGRAPHIC APPARATUS AND METHODS FOR LOADING AND UNLOADING SUBSTRATES

CROSS-REFERENCE TO RELATED APPLICATIONS

This application claims the benefit of U.S. provisional application 61/071,440, which was filed on 29 Apr. 2008, and which is incorporated herein in its entirety by reference.

FIELD

The present invention relates to support structures for substrates usable, for example, in the inspection and/or manufacture of devices by lithographic techniques and to methods of loading and unloading substrates from support structures.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is desirable to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

During various processes within a lithography system, such as during inspection of a substrate by an inspection apparatus or during the transfer of a pattern to a substrate in a lithographic apparatus, as well as other processes that may be performed in a lithography system, a substrate may be supported on a substrate support or support structure. In order to be able to transfer the substrate from one part of a lithography system to another, for example in order to perform different processes, and in order to allow the substrates to be transferred into and out of the lithography system, it is desirable for the substrate to be loaded to and unloaded from the support structure. Accordingly, it has previously been known to provide a substrate support with one or more ejector pins which rise up from the substrate support, lifting the substrate away from the surface of the substrate support on which the substrate rests. During an unloading procedure, the substrate is lifted from the surface of the substrate support by the ejector pins. Once the substrate has been lifted, a substrate handler gripper or end-effector is inserted under the substrate, between the ejector pin(s), and is used to lift the substrate from the ejector pins. For a substrate loading process, the process is reversed.

It is desirable to operate lithography systems within carefully controlled environments. Accordingly, lithography systems are conventionally operated in so-called "clean rooms". However, it will be appreciated that providing clean rooms having an appropriate level of air quality is costly. Accordingly, it is desirable to install as many lithography systems as possible within a given size of clean room. Therefore, it is desirable for lithography systems to be as compact as possible.

SUMMARY

It is desirable to provide a support structure that minimizes the space required to load and unload substrates to and from the support structure.

According to an aspect of the invention, there is provided a substrate support, configured to support a substrate during the performance of a process within a lithography system, including a support surface; and a lifting structure; wherein the support surface is configured to support a bottom face of the substrate during the performance of the process such that the bottom face lies in a plane parallel to the support surface; the lifting structure includes a lifting face and is configured such that the lifting face is configured such that the lifting face can be moved between a first position, in which the lifting face supports the bottom face of the substrate at a position set apart from the support surface, and a second position, in which the lifting structure is arranged such that it does not prevent the substrate from being supported by the support surface; and the lifting structure is configured such that, in moving between the first and second positions, it moves the substrate in a combination of movement substantially perpendicular to a plane parallel to the support surface and movement substantially parallel to the support surface.

According to an aspect of the invention, there is provided an inspection apparatus, lithographic apparatus or lithographic cell configured to measure a property of a substrate, or impart a pattern to the substrate, that includes such a support structure.

According to an aspect of the invention, there is provided a method for loading a substrate to a substrate support, wherein the substrate support is configured to support the substrate during the performance of a process within a lithography system; the substrate support includes a lifting structure, configured to move the substrate between first and second positions, and a support surface, configured to support a bottom face of the substrate during the performance of the process such that the bottom face lies in a plane parallel to the support surface; and the method includes: moving the lifting structure from the first position, in which a lifting face of the lifting structure supports the bottom face of the substrate at a position set apart from the support surface, to the second position, in which the lifting structure is arranged such that it does not prevent the substrate from being supported by the support surface; wherein, in moving from the first position to the second position, the lifting face of the lifting structure moves the substrate in a combination of movement substantially perpendicular to a plane parallel to the support surface and movement substantially parallel to the support surface.

According to an aspect of the invention, there is provided a method for unloading a substrate from a substrate support; wherein the substrate support is configured to support the substrate during the performance of a process within a lithography system; the substrate support includes a lifting structure, configured to move the substrate between first and second positions, and a support surface, configured to support a bottom face of the substrate during the performance of the process such that the bottom face lies in a plane parallel to the support surface; and the method includes moving the lifting structure from the second position, in which the lifting structure is arranged such that it does not prevent the substrate from being supported by the support surface, to the first position, in which a lifting face of the lifting structure supports the bottom face of the substrate at a position set apart from the support surface; wherein, in moving from the second position to the first position, the lifting face of the lifting structure moves the substrate in a combination of movement substantially perpendicular to a plane parallel to the support surface and movement substantially parallel to the support surface.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 depicts a scatterometer in accordance with an embodiment of the invention;

FIG. 4 depicts a scatterometer in accordance with an embodiment of the invention;

DETAILED DESCRIPTION

Figure 1:
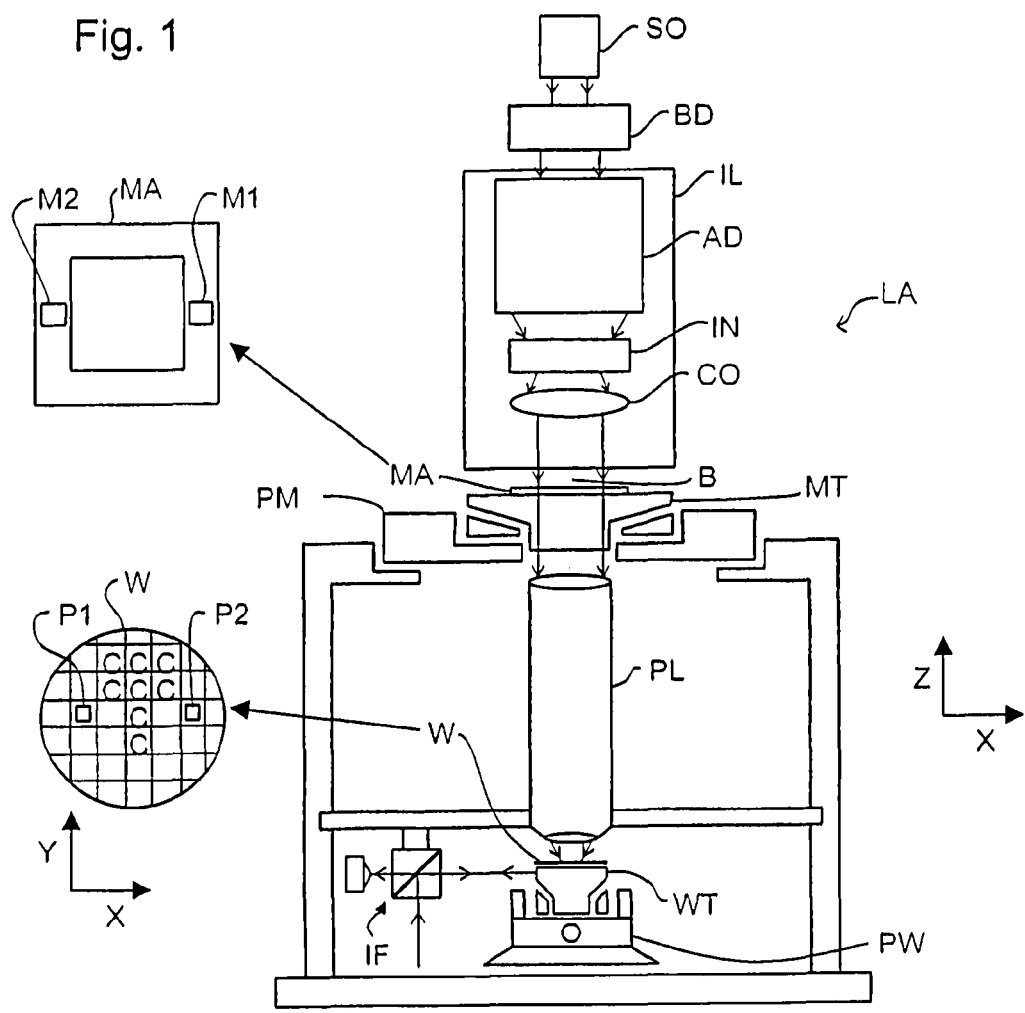
FIG. 1 depicts a lithographic apparatus in accordance with an embodiment of the invention.

FIG. 1 schematically depicts a lithographic apparatus. The apparatus includes an illumination system (illuminator) IL configured to condition a radiation beam B (e.g. UV radiation or DUV radiation); a patterning device support or support structure (e.g. a mask table) MT constructed to support a patterning device (e.g. a mask) MA and connected to a first positioner PM configured to accurately position the patterning device in accordance with certain parameters; a substrate support or table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device (e.g. mask table) MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
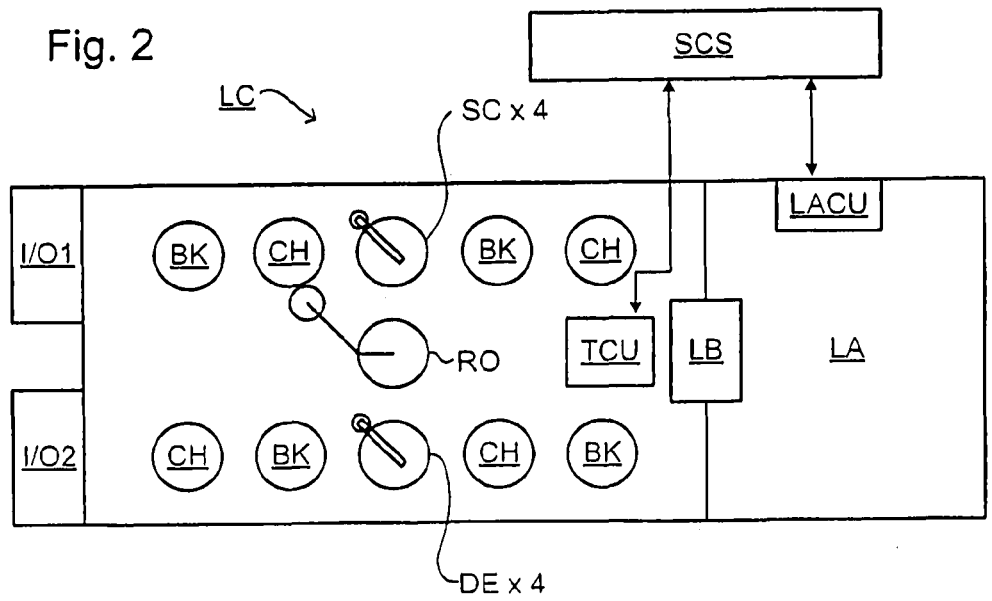
FIG. 2 depicts a lithographic cell or cluster in accordance with an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

FIG. 3 depicts a scatterometer SM1 which may be used in an embodiment of the present invention. It includes a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer SM2 that may be used with an embodiment of the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than including a set of different filters. A grating could be used instead of interference filters.

The detector 18 may measure the intensity of scattered radiation at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband radiation or light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\delta\lambda$ and a spacing of at least 2 $\delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

An embodiment of the present invention provides a substrate support or support structure that is configured to support a substrate and may be used in any required part of a lithography system or lithography cell, such as, for example, a lithography apparatus or an inspection apparatus. The substrate support includes a support surface on which the substrate is supported during the performance of a process within the lithography system, such as a process for inspecting the substrate or a process for transferring a pattern to the substrate. The substrate support also includes a lifting structure that is configured to move the substrate between a first position, in which the substrate is lifted up from the support surface to enable a gripper or end-effector to be inserted under the substrate in order to lift it away from the substrate support, and a second position, in which the bottom face of the substrate is supported on the support surface of the substrate support. It should be appreciated that, in the description of this application, the expressions up, down, top, bottom may be used for clarity of the description of the present invention and reflect a conventional arrangement of a substrate support, in which a substrate is supported vertically above it. However, the substrate support of one or more embodiments of the present invention may, by appropriate modifications, be used at any orientation and references to up, down, top, bottom, or similar, should not be construed to be limitations on the orientation of the substrate support.

The substrate support of an embodiment of the present invention is configured such that the lifting structure that moves the substrate between the first and second positions moves the substrate in a combination of movement substantially perpendicular to a plane parallel to the support surface and movement substantially parallel to the support surface. Accordingly, in addition to lifting the substrate up to enable the gripper or end-effector to be moved between the substrate and the support surface, the substrate may be moved towards the position of the gripper or end-effector that is to be used to remove the substrate from the substrate support.

It will be appreciated that the range of movement desired by the gripper or end-effector in order to be able to remove the substrate from the substrate support of an embodiment of the present invention may be reduced in comparison to a conventional substrate support in which the ejector pins simply lift the substrate. Accordingly, the substrate handling apparatus including the gripper or end-effector, may be simplified, reducing the space requirement within the lithography system for the substrate handling apparatus. Alternatively or additionally, for a given substrate handling apparatus, the substrate handling apparatus may be located further from the position on the substrate support at which the substrate is processed, facilitating the arrangement of the components provided within the lithography system to process the substrate.

The arrangement of a substrate support having a lifting structure as described above may also enable the simplification of other components within the lithography system. For example, it is typically desirable in a lithography system to determine the precise position of the substrate once it has been loaded to a substrate support before any subsequent processing may begin. Accordingly, an edge sensor is typically provided that measures the position of the edge of the substrate relative to the substrate support in order to determine its position.

In a conventional substrate support, in which the ejector pins simply lower the substrate onto the support surface, it may be desirable to move the support surface to the edge sensor for it to inspect the edge of the substrate so that it does not obstruct the lowering of the substrate onto the support surface during a loading operation. However, in an arrangement such as in an embodiment of the present invention, in which the substrate may be moved in a combination of a movement substantially perpendicular to the support surface and a movement substantially parallel to the support surface, the substrate support need not be moved to the edge sensor because the substrate may be lowered such that, as it is lowered to the support surface, it moves laterally to pass under the edge sensor. Such an arrangement may be beneficial because it reduces the constraints on the design of the edge sensor. In addition, by reducing the requirement for a separate movement of the substrate support towards the edge sensor, the time required to load a substrate to the substrate support and accurately measure its position relative to the substrate support is reduced. Accordingly, the throughput of the lithographic system may be improved.

Figure 5:
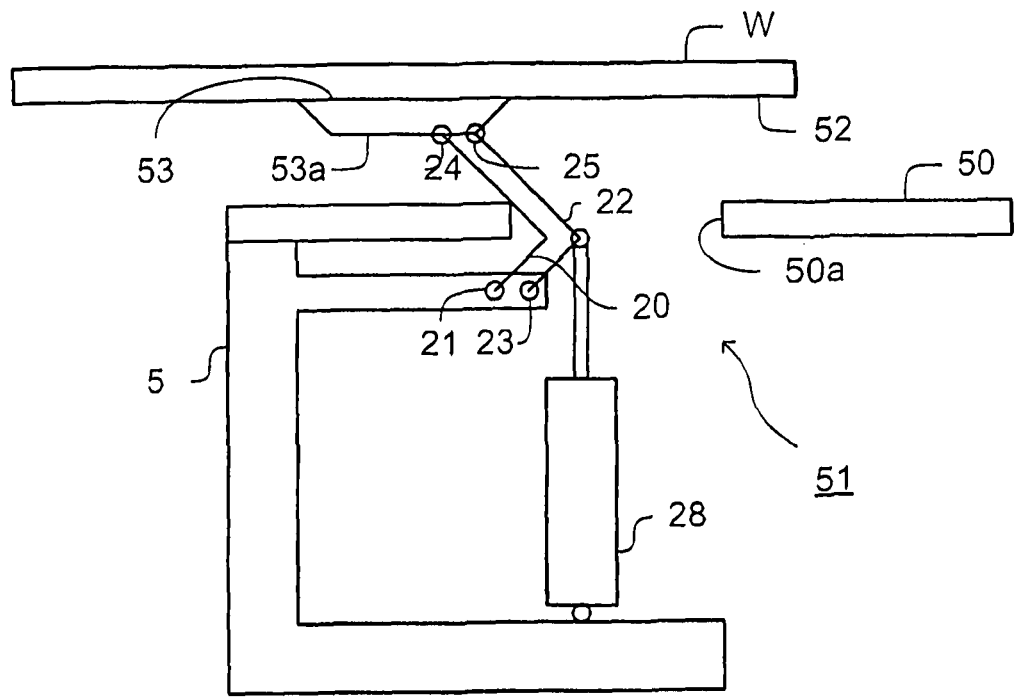
FIG. 5 depicts an embodiment of a support according an embodiment of the present invention in a first position.
Figure 6:
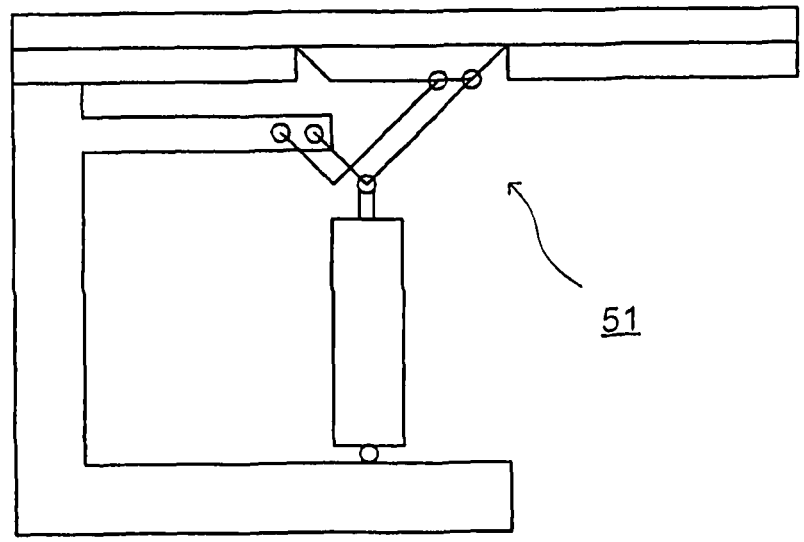
FIG. 6 depicts the support of FIG. 5 in a second position.

FIGS. 5 and 6 depict a substrate support 5 according to an embodiment of the present invention in first and second positions, respectively. As shown, the substrate support 5 includes a support surface 50 configured to support the bottom face 52 of a substrate W and a lifting structure 51 that is configured to move the substrate W between the first and second positions. As shown in FIG. 5, in the first position, the substrate W is supported at a distance apart from the support surface 50 of the substrate support, for example to enable a gripper or end-effector to be moved between the support surface 50 and the substrate W, enabling the substrate W to be loaded to the substrate support or removed from the substrate support 5. As shown in FIG. 5, in the first position, the bottom face 52 of the substrate W is supported on a lifting face 53 of the lifting structure 51.

In the second position, the lifting structure is moved and the bottom face 52 of the substrate W is supported by the support surface 50 of the substrate support. As shown in FIGS. 5 and 6, the support surface 50 may include an opening 50a through which the lifting structure 51 may pass. Accordingly, the lifting face 53 of the lifting structure 51 may support the center of the substrate W in order to provide stable support. In an alternative arrangement, however, the lifting structure may be arranged such that the lifting face supports the bottom face 52 of the substrate W at two or more areas around the center of the substrate W in order to provide stable support. In this case, corresponding openings may be provided within the support surface 50. Alternatively, the lifting face 53 of the lifting structure 51 may be arranged around the support surface 50 of the substrate support and arranged to support the substrate W at its edges.

As shown, the lifting structure 51 may be configured such that, when it is in the second position, the lifting face lies within the same plane as the support surface 50. In such an arrangement, the lifting face 53 of the lifting structure 51 may support the substrate W in addition to the support surface 50 during the desired processing of the substrate W. This may reduce bending of the substrate during processing. In such an arrangement, it may be desirable to ensure that the lifting face 53 is precisely aligned with the support surface of the substrate. In order to ensure this, the lifting face 53 may be mounted to the lifting structure 51 using an intermediate support, configured such that the position of the lifting face 53 can be finely adjusted relative to the intermediate support, for example during commissioning of the apparatus. Alternatively, the lifting structure 51 may be configured such that, in the second position, the lifting face 53 moved to a position below the support surface 50 such that the substrate W is solely supported by the support surface 50 of the substrate support. This may reduce the requirement for the accuracy of the positional control of the lifting structure because it will not need to be precisely aligned with the support surface, when in the second position.

The lifting structure may include an actuator system for moving the lifting face 53 between the first and second positions. In particular, the actuator system may be configured such that, when moving from the first position to the second position, the lifting face not only moves in a vertical direction, namely substantially perpendicular to the support surface, but also moves in a lateral direction, namely a movement substantially parallel to the support surface 50.

The lifting structure may be configured such that the first and second positions of the lifting surface 53 are separated by a distance in a direction substantially perpendicular to the support surface 50, enabling a gripper or end-effector to pass between the support surface 50 and a substrate W supported on the lifting face 53 of the lifting structure 51. In addition, the lifting structure may be configured such that the first and second positions of the lifting face 53 of the lifting structure 51 are separated by a distance in a direction substantially parallel to the support surface 50. In such an arrangement, the distance desired for a gripper or end-effector to move in order to support a substrate W in a stable fashion, while loading a substrate to the substrate support or unloading a substrate from the substrate support, may be reduced in comparison to an arrangement in which the substrate W is lifted only in a vertical direction.

The combination of movements provided by the lifting structure 51 of the embodiment depicted in FIGS. 5 and 6, is effected the provision of a rigid link 20, mounted between the substrate support 5 and the base 53a of the lifting face 53 (e.g. a frame of the substrate support). As shown in FIGS. 5 and 6, a first end of the rigid link 20 is mounted to the substrate support 5 such that the rigid link 20 may rotate about an axis 21 that lies within a plane that is substantially parallel to the support surface 50. During movement between the first and second positions by the lifting structure 51, the rigid link 20 rotates about the axis 21, resulting in movement of a second end of the rigid link 20, that is mounted to the base 53a of the lifting face 53, that is a combination of a vertical movement and a lateral movement. In particular, the lateral component of the movement may include movement in a direction substantially parallel to the support surface 50 but substantially perpendicular to the axis 21 about which the rigid link 20 rotates.

As depicted in FIGS. 5 and 6, the lifting face 53 may be mounted to the rigid link 20 such that, as the rigid link 20 rotates about the axis 21, the lifting face 53 does not rotate. Accordingly, the lifting face 53 may remain substantially parallel to the support surface 50 such that the substrate W supported by the lifting face 13 remains stable.

In a particular arrangement of the embodiment, as depicted in FIGS. 5 and 6, the condition that the lifting face 53 does not rotate as the rigid link 20 rotates may be effected by the provision of a second rigid link 22 mounted between the substrate support 5 and the base 53a of the support face 53. A first end of second rigid link 22 is mounted to the substrate support 5 such that it rotates about an axis 23 that is substantially parallel to the axis 21 about which the first rigid link rotates. In addition, both rigid links 20,22 are rotatably mounted to the base 53a of the lifting face 53 such that the rigid links 20,22 may rotate relative to the base 53a of the lifting face 53 about respective axes 24,25 that are both substantially parallel to the axes of rotation 21,23 of the first and second rigid links 20,22 relative to the substrate support 5. The mounting of the rigid links 20,22 is configured such that the separation of the axes of rotation 21,23 of the rigid links 20,22 relative to the substrate support 5 is the same as the separation between the axes of rotation 24,25 of the rigid links 20,22 relative to the base 53a of the lifting face 53. The rigid links 20,22 are configured such that the separation of the axes 21,24 about which the first rigid link 20 rotates relative to the substrate support 5 and the base 53a of the lifting face 53, respectively, is the same as the separation between the axes 23,25 of the second rigid link 22 about which the second rigid link 22 rotates relative to the substrate support 5 and the base 53a of the lifting face 13, respectively.

An arrangement of linkages such as that discussed above may ensure that, regardless of the rotation of the first and second rigid links 20,22, the lifting face 53 does not rotate relative to the support surface 10. Consequently, a substrate W supported by the lifting face 53 does not rotate relative to the support surface 10, ensuring that the substrate remains stable, during the movement between the first and second positions.

It will be appreciated that the actuator system depicted in FIGS. 5 and 6 provides a relatively simple arrangement for ensuring that the lifting face 53 does not rotate relative to the support surface 50 during movement from the first position to the second position.

However, alternative configurations may be used. For example, a second actuator system may be provided to control the relative angular positions of the rigid link 20 and the lifting face 20. In addition, it will be appreciated that additional rigid links may be added to the system, provided that the relationship between each of the links corresponds to that of the first and second links discussed above.

An actuator 28 may be provided in order to drive the lifting structure 51 between the first and second positions. In the arrangement depicted in FIGS. 5 and 6, a linear actuator is provided in order to cause the rigid links 20,22 to rotate. However, alternative configurations may be used. For example, a rotary actuator may be provided in order to drive the rotary motion of one or more of the rigid links 20,22.

Figure 7:
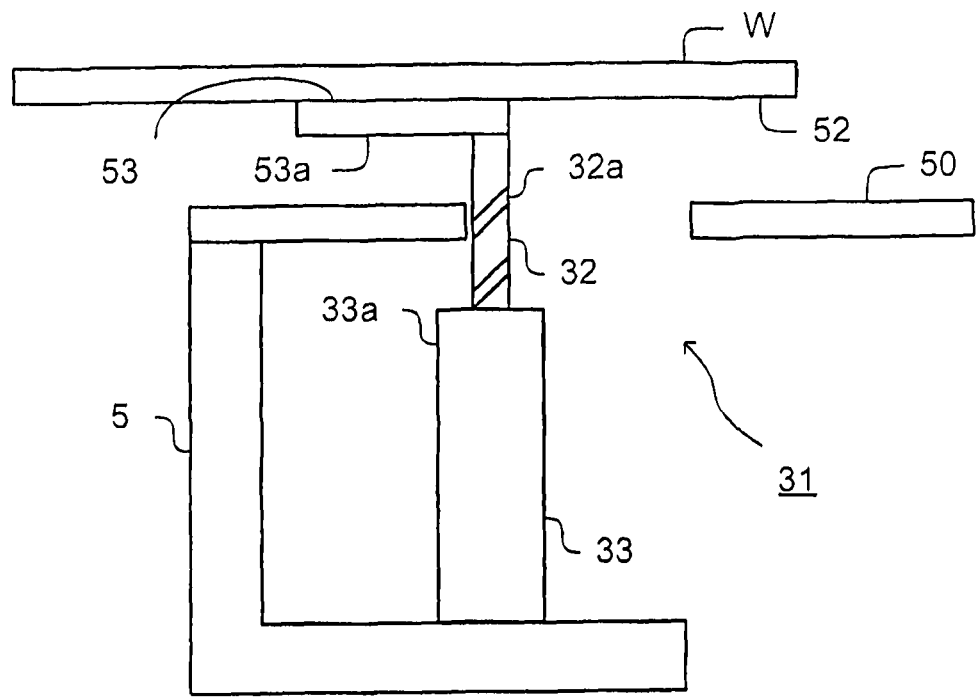
FIG. 7 depicts an embodiment of a support according to an embodiment of the present invention in a first position.
Figure 8:
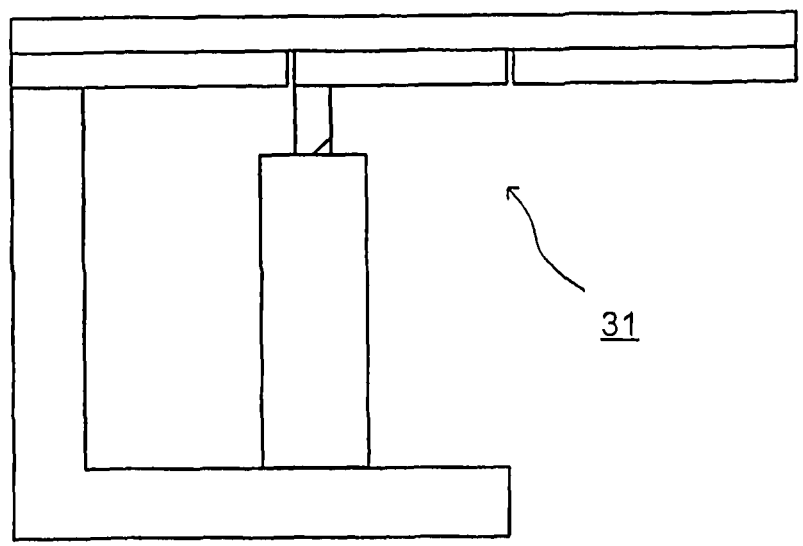
FIG. 8 depicts the embodiment of FIG. 7 in a second position.

FIGS. 7 and 8 depict a substrate support according to an embodiment in first and second positions, respectively. This embodiment corresponds to the embodiment of FIGS. 5 and 6 discussed above and only the differences will be discussed. Common parts are denoted by the same reference numerals.

As shown, the embodiment of FIGS. 7 and 8 differs from the embodiment of FIGS. 5 and 6 by the configuration of the lifting structure 31. In particular, the lifting structure 31 of the embodiment of FIGS. 7 and 8 includes an elongate rod 32 rigidly attached to the base 13a of the lifting face 13. The elongate rod 32 is arranged such that its elongate direction is substantially perpendicular to the support surface 50.

The lifting structure further includes an actuator 33 that is configured such that, in movement between the first and second positions, the elongate rod 32 moves in both a linear direction substantially parallel to the elongate direction of the rod 32, namely moves in a direction substantially perpendicular to the support surface 50, and rotates about an axis substantially parallel to the elongate direction 32. Preferably, the elongate rod 32 rotates about its own axis.

Accordingly, in moving between the first and second directions, the lifting face 53 moves in a direction substantially perpendicular to the support surface 50 and rotates about the same axis as the elongate rod 32. The lifting face 53 may be fixedly connected to the elongate rod 32 such that the axis of rotation of the elongate rod 32 and the lifting face 53 does not coincide with the center of the lifting face 53. For example, as depicted in FIGS. 7 and 8, the elongate rod 32 is connected to one side of the lifting face 53. Accordingly, as the elongate rod 32 and the lifting face 53 rotate, the substrate W moves laterally, namely in a direction substantially parallel to the surface of the support surface 50. Accordingly, as discussed above, at the same time as raising the substrate W to enable the gripper or end-effector to pass between the support surface 50 and the bottom face 52 of the substrate W, the movement of the lifting face 53 may move the substrate W closer to the location of the substrate handling apparatus, reducing the required range of movement of the gripper or end-effector.

In particular arrangements, the lifting structure 31 may be configured such that, in a movement from the first position to the second position, the elongate rod 32, the lifting face 53 and, accordingly, the substrate W, rotate only as much as is necessary. For example, a rotation of about 90° may be sufficient to move the substrate W sufficiently close to the substrate handling apparatus. In an alternative arrangement, the elongate rod 32, the lifting face 53 and the substrate W may rotate about 180°. Such an arrangement may maximize the lateral movement of the substrate W, namely the movement substantially parallel to the support surface. In such an arrangement, the axis of rotation of the elongate rod 32 may be arranged between the position of the support surface 13 when the lifting mechanism is in the second position, namely when the substrate W is supported by the support surface 50, and the location of the substrate handling apparatus. Minimizing the extent of rotation of the elongate rod 32 in movements between the first and second positions may minimize wear.

In alternative arrangements, the elongate rod 32, the support face 53 and the substrate W may rotate by larger angles during movements between the first and second positions than the angle that separates the positions of the elongate rod 32 and support surface 53 when in the first and second positions. For example, in order to avoid interference with other components, it may be desirable for the elongate rod 32 and the lifting face 53 to rotate by about 270° in a first direction in order to achieve a net 90° rotation in a second direction, opposite to the first direction. Alternatively or additionally, depending on the arrangement of the actuator system provided to move the elongate rod 32 between the first and second positions, it may be desirable for the elongate rod 32 and the lifting face 53 to rotate by additional complete revolutions. Accordingly, if the first and second positions are separated by about 180°, it may be desirable for the elongate rod 32 and the lifting face 53 to rotate by a total of 540° during the movement between the first and second positions.

The actuator 33 may include separate actuators for providing the rotary motion of the elongate rod 32 and the linear motion of the elongate rod 32, namely the movement of the elongate rod 32 in a direction substantially perpendicular to the support surface 10.

Alternatively, the actuator 33 may include a guide 33a and a single actuator. For example, a rotary actuator may be provided that rotates the elongate rod 32 as desired to move between the first and second positions. In this arrangement, the guide 33a may be configured to provide and control the movement of the elongate rod 32 in the linear direction parallel to the axis of rotation of the elongate rod in response to the rotation of the elongate rod. Alternatively, a linear actuator may be provided that provides the linear movement of the elongate rod 32 in the direction perpendicular to the support surface 50. In this arrangement, the guide 33a may be configured to provide and control the rotation of the elongate rod 32 about an axis substantially parallel to the linear movement of the elongate rod 32 in response to the linear movement.

In an example, one of the elongate rod 32 and the guide 33a may include a groove 32a and the other may include a pin that is configured to slide within the groove 32a in order to control the relationship between the rotational movement of the elongate rod 32 and its linear movement. At least a portion of the groove 32a may follow a helical path. Such an arrangement may provide a constant relationship between the rotation of the elongate rod 32 and the linear movement of the elongate rod 32, reducing wear.

In a particular arrangement, that may be provided by any appropriate actuator configured to control the movement of the elongate rod 32, the elongate rod 32 may be arranged such that, as it moves from the second position to the first position, the elongate rod 32 initially moves only in a linear direction, namely does not rotate. In such an arrangement, the elongate rod 32 may move in a linear direction substantially perpendicular to the support surface 50 until the lifting face 53 and its base 53a have moved sufficiently far from the support surface 50 such that, when the elongate rod 32 and the lifting face 13 rotate, the lifting face 13 and its base 13a do not collide with the support surface 50 or another part of the substrate support 5.

Figure 9:
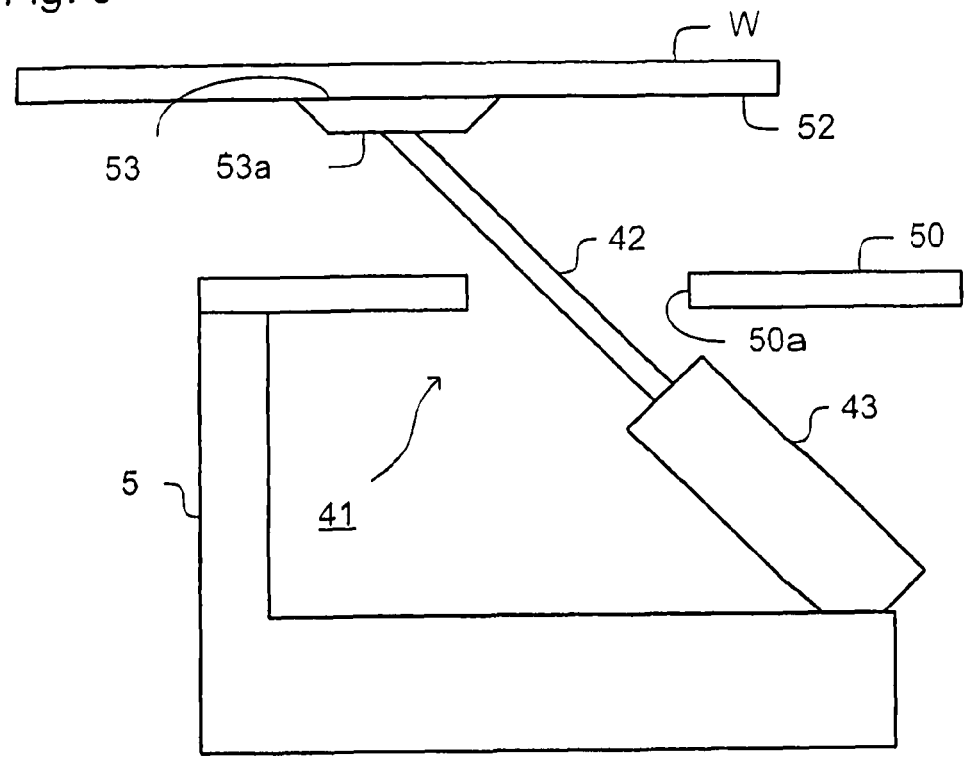
FIG. 9 depicts an embodiment of a support according to an embodiment of the present invention in a first position.
Figure 10:
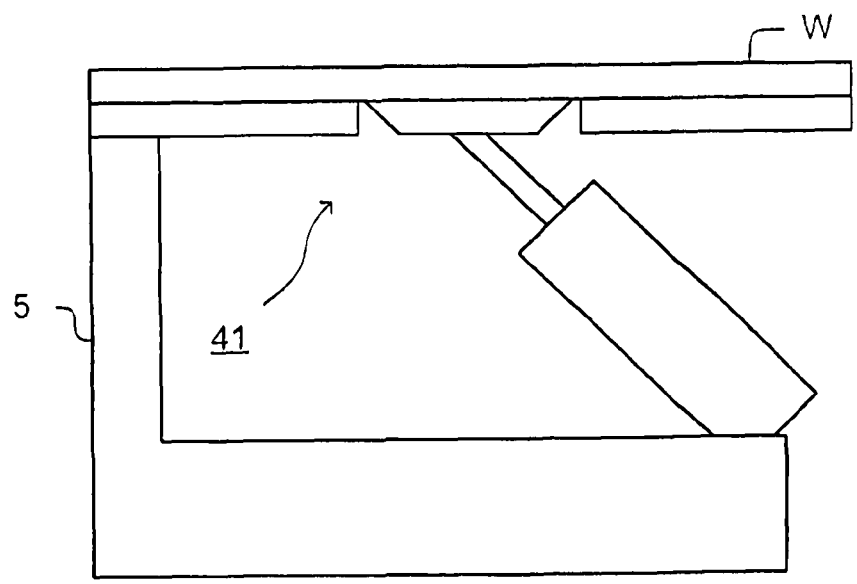
FIG. 10 depicts the embodiment of FIG. 9 in a second position.

FIGS. 9 and 10 depict an embodiment of the present invention in first and second positions, respectively. As before, only the differences between the embodiment of FIGS. 9 and 10 and the embodiments of FIGS. 5, 6, 7 and 8 are discussed and common reference numerals are used for common parts.

The difference between the embodiment of FIGS. 9 and 10 and the embodiments of FIGS. 5, 6, 7 and 8 is the arrangement of the lifting structure. As shown, the lifting structure 41 of the embodiment of FIGS. 9 and 10 includes an elongate rod 42 fixedly connected to the base 53a of the lifting face 53. The elongate rod 42 is arranged such that its elongate direction is at an oblique angle to the support surface 50. An actuator 43 is provided and configured to move the elongate rod 42, and therefore the lifting face 53 and the substrate W, in a linear direction parallel to the elongate direction of the elongate rod 42. Accordingly, the movement of the elongate rod 42, the lifting face 53 and the substrate W, when actuated by the actuator system 43, includes a component in a direction perpendicular to the support surface 10 and a component in a direction substantially parallel to the support surface 50.

Therefore, a simple linear actuator may be configured to move the substrate W between the first and second positions. Accordingly, the substrate W may be moved between a position in which it is supported on the substrate support 5 and a position in which the substrate W is moved away from the support surface 50 in order to permit a gripper or end-effector to be moved between the support surface 50 and the substrate W. Simultaneously, the substrate may be moved laterally, such that it is closer to the substrate handling apparatus.

For all of the embodiments discussed above, it will be appreciated that the substrate W may be secured to the lifting face 53 of the lifting structure 51;31;41 as it moves between the first and second positions. For example, the substrate may be secured to the lifting face 53 by vacuum clamping. Accordingly, a vacuum channel may be provided between a fixed part of the lithographic apparatus, such as the substrate support 5 and the lifting face 53. Accordingly, for example, in the embodiment of FIGS. 5 and 6, a vacuum channel may be provided within one or more of the rigid links 20,22. Likewise, in the embodiment of FIGS. 7 and 8, a vacuum channel may be provided within the elongate rod 32. In the embodiment of FIGS. 9 and 10, a vacuum channel may be provided within the elongate rod 42.

As will be appreciated, because the rigid links and elongate rods through which the vacuum channels may pass are arranged to move relative to the static portions of the lithographic apparatus, such as the substrate support 5, gas seals may be provided at the boundaries between vacuum channels in two moving parts and at the boundary of vacuum channels in a moving part and a stationary part. The gas seals may, for example, be formed from plastic. However, it may be desirable for the seals to be electrically conducting in order to ensure that each part of the lifting structure 51;31;41 is electrically grounded in order to prevent any sparks during substrate loading and/or unloading. Accordingly, the seals may be formed from a plastic that includes an electrically conducting filler, such as carbon, such that the seals are electrically conducting and provide a path for electrical conductance through the lifting structure 51;31;41.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography typography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A substrate support configured to support a substrate within a lithography system, the substrate support comprising:
   a support surface configured to support a bottom face of the substrate such that the bottom face lies in a plane substantially parallel to the support surface;
   a lifting structure comprising a lifting face and a lifting base and configured to move the lifting face and the lifting base between a first position, in which the lifting face supports the bottom face of the substrate at a position set apart from the support surface, and a second position, in which the lifting structure is arranged such that the lifting structure does not prevent the substrate from being supported by the support surface, the lifting structure being configured such that, in moving between the first and second positions, the lifting structure moves the substrate in a combination of movement substantially perpendicular to a plane parallel to the support surface and movement substantially parallel to the support surface; and
   an actuator configured to control the movement of the lifting structure between the first and second positions, the actuator comprising rigid link mounted to the lifting base, such that the rigid link rotates relative to the lifting base about an axis substantially parallel to a plane of the support surface,
   wherein the actuator is configured such that, in moving the lifting face between the first and second positions, the lifting face does not rotate about the axis substantially-parallel to the plane of the support surface.

2. The substrate support according to claim 1, wherein the support surface comprises an opening, and the lifting structure is configured to move in the opening when moving between the first and second positions.

3. The substrate support according to claim 1, wherein the lifting structure is configured such that, when the lifting structure is in the first position, the substrate is sufficiently set apart from the support surface that a substrate support structure of a substrate handling apparatus can be moved between the support surface and the bottom face of the substrate supported by the lifting face.

4. The substrate support according to claim 1, wherein the first and second positions are set apart in a first direction substantially perpendicular to the support surface and in a second direction substantially parallel to the support surface.

5. The substrate support according to claim 1, wherein the lifting structure is configured such that, when the lifting structure is in the second position, the lifting face of the lifting structure and the support surface both support the bottom face of the substrate.

6. The substrate support according to claim 1, wherein:
   the actuator comprises a second rigid link mounted within the substrate support, such that the rigid link and the second rigid link rotate about mutually substantially parallel axes; and
   the second rigid link is rotatably mounted to the lifting base such that a separation between mounting locations of the rigid links to a frame of the substrate support is substantially the same as a separation between corresponding mounting locations of the respective rigid links to the lifting base.

7. A substrate support configured to support a substrate within a lithography system, the substrate support comprising:
   a support surface configured to support a bottom face of the substrate such that the bottom face lies in a plane substantially parallel to the support surface;
   a lifting structure comprising a lifting face and a lifting base and configured to move the lifting face and the lifting base between a first position, in which the lifting face supports the bottom face of the substrate at a position set apart from the support surface, and a second position, in which the lifting structure is arranged such that the lifting structure does not prevent the substrate from being supported by the support surface, the lifting structure being configured such that, in moving between the first and second positions, the lifting structure moves the substrate in a combination of movement substantially perpendicular to a plane parallel to the support surface and movement substantially parallel to the support surface wherein the substrate remains substantially parallel to the support surface during the movement between the first and second positions; and an actuator configured to control the movement of the lifting structure between the first and second positions, the actuator comprises a rod that is rigidly mounted to the lifting base, wherein the rod is elongated and arranged such that its elongate direction is at an oblique angle relative to a plane substantially parallel to the support surface.

8. The substrate support according to claim 7, wherein the lifting structure is configured such that, when the lifting structure is in the second position, the lifting face of the lifting structure and the support surface both support the bottom face of the substrate.

9. A substrate support configured to support a substrate within a lithography system, the substrate support comprising:

a support surface configured to support a bottom face of the substrate such that the bottom face lies in a plane substantially parallel to the support surface;

a lifting structure comprising a lifting face and a lifting base and configured to move the lifting face and the lifting base between a first position, in which the lifting face supports the bottom face of the substrate at a position set apart from the support surface, and a second position, in which the lifting structure is arranged such that the lifting structure does not prevent the substrate from being supported by the support surface, the lifting structure being configured such that, in moving between the first and second positions, the lifting structure moves the substrate in a combination of movement substantially perpendicular to a plane parallel to the support surface and movement substantially parallel to the support surface; and an actuator configured to control the movement of the lifting structure between the first and second positions, the actuator comprises a rod that is rigidly mounted to the lifting base, wherein:

the rod is elongated and arranged such that its elongate direction is substantially perpendicular to a plane parallel to the support surface, the rod is configured such that, in moving the lifting face between the first and second positions, the rod moves in a linear direction substantially parallel to the elongate direction and rotationally about an axis substantially parallel to the elongate direction, and the rod is mounted to the lifting base at a point separated from a center of the lifting face such that, when the rod and lifting face rotate about the axis substantially parallel to the elongate direction, the center of the lifting face moves in a direction substantially parallel to the support surface.

10. The substrate support according to claim 9, wherein, when the lifting face moves between the first and second positions, the rod and the lifting face rotate by about 90° or 180°.

11. The substrate support according to claim 9, wherein the actuator is configured such that, when the lifting structure moves from the second position to the first position, the rod initially moves only in a linear direction substantially parallel to the elongate direction and then the rod rotates about the axis substantially parallel to the elongate direction.

12. The substrate support according to claim 9, wherein the actuator further comprises a guide configured to control an extent of rotation of the rod about the axis substantially parallel to the elongate direction.

13. The substrate support according to claim 9, wherein the lifting structure is configured such that, when the lifting structure is in the second position, the lifting face of the lifting structure and the support surface both support the bottom face of the substrate.

14. An inspection apparatus configured to measure a property of a substrate, the apparatus comprising a substrate support configured to support a substrate during an inspection of the substrate, the substrate support including:

a support surface configured to support a bottom face of the substrate such that the bottom face lies in a plane substantially parallel to the support surface;

a lifting structure comprising a lifting face and a lifting base and configured to move the lifting face and the lifting base between a first position, in which the lifting face supports the bottom face of the substrate at a position set apart from the support surface, and a second position, in which the lifting structure is arranged such that the lifting structure does not prevent the substrate from being supported by the support surface, the lifting structure being configured such that, in moving between the first and second positions, the lifting structure moves the substrate in a combination of movement substantially perpendicular to a plane parallel to the support surface and movement substantially parallel to the support surface; and an actuator configured to control the movement of the lifting structure between the first and second positions, the actuator comprising a rigid link mounted to the lifting base, such that the rigid link rotates relative to the lifting base about an axis substantially parallel to a plane of the support surface, wherein the actuator is configured such that, in moving the lifting face between the first and second positions, the lifting face does not rotate about the axis substantially-parallel to the plane of the support surface.

15. The inspection apparatus according to claim 14, wherein the lifting structure is configured such that, when the lifting structure is in the second position, the lifting face of the lifting structure and the support surface both support the bottom face of the substrate.

16. A lithographic apparatus, configured to impart a pattern to a substrate, comprising a substrate support configured to support a substrate, the substrate support comprising:

a support surface configured to support a bottom face of the substrate such that the bottom face lies in a plane substantially parallel to the support surface;

a lifting structure comprising a lifting face and a lifting base and configured to move the lifting face and the lifting base between a first position, in which the lifting face supports the bottom face of the substrate at a position set apart from the support surface, and a second position, in which the lifting structure is arranged such that the lifting structure does not prevent the substrate from being supported by the support surface, the lifting structure being configured such that, in moving between the first and second positions, the lifting structure moves the substrate in a combination of movement substantially perpendicular to a plane parallel to the support surface and movement substantially parallel to the support; and an actuator configured to control the movement of the lifting structure between the first and second positions, the actuator comprising a rigid link mounted to the lifting base, such that the rigid link rotates relative to the lifting base about an axis substantially parallel to a plane of the support surface, wherein the actuator is configured such that, in moving the lifting face between the first and second positions, the lifting face does not rotate about the axis substantially-parallel to the plane of the support surface.

17. The lithographic apparatus according to claim 16, wherein the lifting structure is configured such that, when the lifting structure is in the second position, the lifting face of the lifting structure and the support surface both support the bottom face of the substrate.

18. A method for loading a substrate on a substrate support, the substrate support configured to support the substrate within a lithography system, the substrate support comprising a lifting structure, configured to move the substrate between first and second positions, and a support surface, configured to support a bottom face of the substrate such that the bottom face lies in a plane substantially parallel to the support surface, the method comprising:

moving the lifting structure from the first position, in which a lifting face of the lifting structure supports the bottom face of the substrate at a position set apart from the support surface, to the second position, in which the lifting structure is arranged such that the lifting structure does not prevent the substrate from being supported by the support surface, the moving including moving the substrate in a combination of movement substantially perpendicular to a plane parallel to the support surface and movement substantially parallel to the support surface and rotating a rigid link mounted to a lifting base of the lifting structure relative to the lifting base about an axis substantially parallel to a plane of the support surface, wherein in moving the lifting structure between the first and second positions, the lifting face does not rotate about the axis substantially-parallel to the plane of the support surface.

19. The method according to claim 18, wherein when the lifting structure is in the second position, the lifting face of the lifting structure and the support surface both support the bottom face of the substrate.

20. A method for unloading a substrate from a substrate support, the substrate support configured to support the substrate within a lithography system, the substrate support comprising a lifting structure, configured to move the substrate between first and second positions, and a support surface, configured to support a bottom face of the substrate such that the bottom face lies in a plane substantially parallel to the support surface, the method comprising:

moving the lifting structure from the second position, in which the lifting structure is arranged such that the lifting structure does not prevent the substrate from being supported by the support surface, to the first position, in which a lifting face of the lifting structure supports the bottom face of the substrate at a position set apart from the support surface, the moving comprising moving the face of the lifting structure in a combination of movement substantially perpendicular to a plane parallel to the support surface and movement substantially parallel to the support surface and rotating a rigid link mounted to a lifting base of the lifting structure relative to the lifting base about an axis substantially parallel to a plane of the support surface, wherein in moving the lifting structure between the first and second positions, the lifting face does not rotate about the axis substantially-parallel to the plane of the support surface.

21. The method according to claim 20, wherein when the lifting structure is in the second position, the lifting face of the lifting structure and the support surface both support the bottom face of the substrate.

* * * * *